United States Patent [19]

Murasato et al.

[11] Patent Number: 5,744,829
[45] Date of Patent: Apr. 28, 1998

[54] AlGaInP LIGHT EMITTING DIODE

[75] Inventors: Shigetaka Murasato; Yasuyuki Sakaguchi, both of Chichibu, Japan

[73] Assignee: Showa Denko K. K., Tokyo, Japan

[21] Appl. No.: 773,348

[22] Filed: Dec. 26, 1996

[51] Int. Cl.⁶ .................................................. H01L 33/00
[52] U.S. Cl. .................................. 257/94; 257/96; 257/97; 257/98; 372/43; 372/45; 372/46
[58] Field of Search ........................ 257/94, 96, 97, 257/98; 372/43, 45, 46

[56] References Cited

U.S. PATENT DOCUMENTS

| | | | |
|---|---|---|---|
| 5,008,718 | 4/1991 | Fletcher et al. | 372/45 X |
| 5,300,788 | 4/1994 | Fan et al. | 257/13 |
| 5,403,916 | 4/1995 | Watanabe et al. | 437/127 |
| 5,442,203 | 8/1995 | Adomi et al. | 257/97 |
| 5,453,405 | 9/1995 | Fan et al. | 437/228 |
| 5,537,433 | 7/1996 | Watanabe | 372/45 |
| 5,565,694 | 10/1996 | Huang et al. | 257/97 |
| 5,625,202 | 4/1997 | Chai | 257/94 |
| 5,661,742 | 8/1997 | Huang et al. | 372/46 |

FOREIGN PATENT DOCUMENTS

| | | |
|---|---|---|
| 3-171679 | 7/1991 | Japan . |
| 7-15038 | 1/1995 | Japan . |

*Primary Examiner*—William Mintel
*Attorney, Agent, or Firm*—Armstrong, Westerman, Hattori, McLeland & Naughton

[57] ABSTRACT

An AlGaInP light-emitting diode includes a double heterojunction light-emitting structure of $(Al_xGa_{1-x})_yIn_{1-y}P$ on a GaAs substrate. A multi-film reflection layer is provided between the GaAs substrate and the double hetero-junction light-emitting structure. The layers forming the double hetero-junction are lattice matched with the GaAs substrate at an epitaxial growth temperature. A GaP current diffusion layer is disposed on the upper surface of the double heterojunction light-emitting structure, and ohmic electrodes are provided on the underside of the GaAs substrate and on the upper surface of the current diffusion layer.

12 Claims, 3 Drawing Sheets

AlGAINP LIGHT EMITTING DIODE

BACKGROUND OF THE INVENTION

1. Field of the Invention

The present invention relates to a compound semiconductor light-emitting diode, and more particularly to an $(Al_xGa_{1-x})_yIn_{1-y}P$ 4-element mixed crystal double hetero-structure semiconductor light-emitting diode that emits green or red light with high efficiency.

2. Description of the Prior Art

Light-emitting diodes (LEDs) utilizing epitaxially grown layers formed on a compound semiconductor substrate are featured by low power consumption, long life, high emission efficiency and high reliability, and are widely used as a light source in various display applications. In particular, in recent years the range of LED utilization has been expanding from indoor applications to outdoor applications. The reason for this that in addition to the former LED merits of compactness and high efficiency, the narrow emission wavelength of LEDs give them high visibility. With respect also to the improved safety provided by the use of LEDs, the increased use is also the result of a general understanding of the superiority that LED displays offer compared to conventional displays that use bulbs. However, there are some constraints on the outdoor use of LEDs, which at present include a paucity of display colors, and insufficient brightness in wavelength regions shorter than red. Of the various group III-V compound semiconductors, a rapid increase is taking place in the use of $(Al_xGa_{1-x})_yIn_{1-y}P$ 4-element mixed crystal epitaxially grown on a GaAs single crystal substrate with which the mixed crystal is lattice matched, owing to the fact that this is a direct-transition type and has the highest bandgap energy, and enables high brightness to be obtained from green to red. Many types of such LED structures are therefore being proposed.

FIG. 4 shows a conventional AlGaInP double hetero-structure LED. The LED in the figure comprises a GaAs substrate 1, a buffer layer 2, and the AlGaInP double hetero-structure comprised of a lower cladding layer 5, an active layer 6 and an upper cladding layer 7. Element 9 is a contact layer and 10 and 11 are electrodes.

A drawback of AlGaInP is the low degree of carrier movement, which makes it difficult to obtain low resistance crystal. It becomes particularly difficult to obtain good quality crystal if the carrier concentration is increased in an effort to reduce the resistance. High resistance crystal raises the series resistance of the device, leading to a higher operating voltage and other such problems. Also, because in such LEDs the upper cladding layer 7 is given a larger bandgap energy differential than the active layer 6, it is necessary to raise the Al concentration. A higher Al concentration means that the carrier concentration cannot be increased, so electrical resistance is increased, and since there is little diffusion of electrical current in the upper cladding layer 7, emission takes place only in the region directly below the electrode 10. Thus, emission efficiency cannot be increased. In conventional AlGaInP LEDs having the above structure, current diffusion in the emission region is poor, reducing external output efficiency.

In order to improve current diffusion in the emission region, a method has been proposed (see JP-A-HEI-3-171679) for diffusing the current injected from the electrode by providing a GaAlAs current diffusion layer 8 between the double hetero-structure and the electrode 10. The structure of that device is shown in FIG. 5. Since the material used to form the current diffusion layer 8 is transparent to the wavelength of the emitted light, the bandgap energy can be increased, the carrier concentration raised to $5 \times 10^{17}$ cm$^{-3}$ or more and the thickness of the layer increased to 5 to 30 μm or more. In accordance with another proposal (see JP-A-HEI-7-15038), a current diffusion layer is formed of AlGaInP having a larger bandgap energy than the emission layer. With an AlGaInP current diffusion layer, there is less light absorption, especially in shorter wavelength regions of 580 nm and below, so relative resistance is also decreased, therefore raising light output efficiency.

In accordance with another proposal (U.S. Pat. No. 5,008,718), a GaP current diffusion layer is used. A GaP layer has a higher bandgap energy than the active layer and therefore is transparent to the emitted light. Since the relative resistance is low, when used as a current diffusion layer the thickness of the diffusion layer can be increased, which means a higher current diffusion effect can be expected.

However, even when the emission region is expanded by thus diffusing the injected current, conventional LEDs are still not bright enough for outdoor applications. Here, brightness is proportional to emission intensity, with the addition of a visibility effect value. Among further problems are that increasing the area of the hetero-junction increases device resistance, which means that a higher operating voltage is required, and the high concentration of Al in the current diffusion layer gives rise to device degradation.

The reason why high brightness cannot be obtained is considered to be that the double hetero-structure is not lattice matched, and that good-quality epitaxial layer growth is not obtained owing to the fact that the many hetero-junction surfaces are involved. Since before, the lattice of $(Al_xGa_{1-x})_yIn_{1-y}P$ mixed crystal has been regarded as matching that of a GaAs substrate when y is 0.5. However, this is at room temperatures. With this composition lattices do not match at epitaxial growth temperatures. At room temperature a GaAs substrate has a lattice constant of 0.56533 nm, and at an epitaxial growth temperature, for example 780° C., the lattice constant is 0.56804 nm, a change of 0.48%. While $(Al_{0.7}Ga_{0.3})_{0.5}In_{0.5}P$ used for the cladding layer has a lattice constant of 0.56640 nm at room temperature, at 780° C. it is 0.56837 nm, an increase of 0.348%. The degree of lattice mismatch between the substrate and the cladding layer is therefore 0.19% at room temperature and 0.058% at 780° C. Thus, while on first impressions epitaxially grown layers of $(Al_xGa_{1-x})_yIn_{1-y}P$ seem to be lattice-matched, there is quite a degree of mismatching. As a result of detailed studies conducted by the present inventors, it was clarified that even if lattice matching may be effected at room temperature, it is all the more important to effect lattice matching at the epitaxial growth temperature. Good crystal growth is obtained if there is lattice matching during the epitaxial growth process, and even if defects are produced in the crystal lattice after cooling to room temperature, the defects will not be enough to affect the brightness, so high brightness can be obtained.

If good-quality epitaxially grown layers are obtained, current diffusion in the upper cladding layer is also improved. Therefore if a current diffusion layer is formed of GaP having a relatively low resistance, the device resistance can be reduced, therefore also enabling the operating voltage (VF characteristics) to be lowered. Moreover, not having to use epitaxially grown layers having a high Al concentration resolves the problem of device degradation, and thereby results in devices that exhibit high reliability.

A main object of the present invention is to provide an LED having a high brightness, a low operating voltage and high reliability.

A further object of the present invention is to provide an LED having an expanded light-emitting region.

SUMMARY OF THE INVENTION

To attain the above object, the present invention provides a LED comprising a GaAs substrate having an ohmic electrode on its rear surface, a reflection layer comprised of a lamination of multiple layers provided on the GaAs substrate, a double hetero-junction light-emitting structure of $(Al_xGa_{1-x})_yIn_{1-y}P$ provided on the reflection layer, said light-emitting structure being comprised of an active layer between upper and lower cladding layers, with each of the layers being lattice matched to the GaAs substrate at an epitaxial growth temperature, a current diffusion layer formed of GaP provided on the double hetero-junction light-emitting structure, and an ohmic electrode provided on the current diffusion layer.

As described above, the present invention uses GaAs single crystal as a substrate, on which is formed a double hetero-junction light-emitting structure of $(Al_xGa_{1-x})_yIn_{1-y}P$, each of the layers comprising the double hetero-junction light-emitting structure is lattice matched at the epitaxial growth temperature, and the LED also has a current diffusion layer formed of GaP. This structure makes it possible to obtain a light-emitting diode that provides high brightness in red to green wavelength regions of 550 to 650 nm at a low operating voltage, and is therefore long-lasting and highly reliable.

Further features of the invention, its nature and various advantages will be more apparent from the accompanying drawings and following detailed description of the invention.

DESCRIPTION OF THE PREFERRED EMBODIMENT

Figure 1:
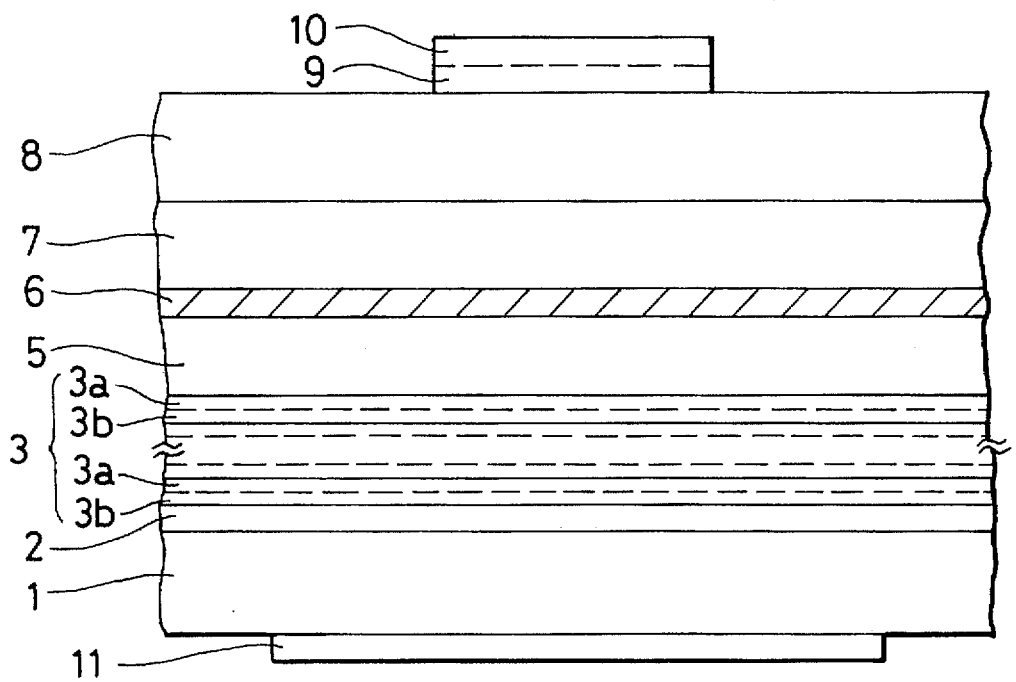
FIG. 1 is a cross-sectional view of the structure of an AlGaInP light-emitting diode according to a first embodiment of the present invention.

FIG. 1 shows the basic structure of an AlGaInP light-emitting diode according to the present invention. With reference to the drawing, a GaAs substrate 1 has an ohmic electrode 11 on its rear surface. A buffer layer 2 is formed on the GaAs substrate 1, and a reflection layer 3 on the buffer layer 2. A double hetero-junction light-emitting structure of $(Al_xGa_{1-x})_yIn_{1-y}P$ comprising an active layer 6 between an upper cladding layer 7 and a lower cladding layer 5 is provided on top of the reflection layer 3.

Each of the layers comprising the double hetero-junction light-emitting structure is lattice matched at the epitaxial growth temperature with respect to the GaAs substrate. A current diffusion layer 8 is provided on the upper cladding layer 7. There is a contact layer 9 on the current diffusion layer 8, and an ohmic electrode 10 on the contact layer 9.

The lattice matching of the double hetero-junction light-emitting structure portion, the most important element of the invention, will be explained first.

The properties of the GaAs crystal that forms the substrate are widely known, but the properties of the $(Al_xGa_{1-x})_yIn_{1-y}P$ 4-element mixed crystal used to form the double hetero-junction have not been clarified. Since AlGaInP is a mixture of AlP, GaP and InP, the properties of the 4-element mixed crystal can be established from the properties of those constituents. The known properties of the crystals are listed in Table 1.

TABLE 1

| Crystal | Lattice constant at room temperature (nm) | Linear expansion coefficient at 0 to 700 K ($\times 10^{-6}/K$) |
| --- | --- | --- |
| AlP | 0.54625 | 4.20 |
| GaP | 0.54512 | 5.91 |
| InP | 0.58688 | 4.56 |
| GaAs | 0.56533 | 6.40 |

These data can be used as a basis to calculate the lattice constant and linear expansion coefficient of the $(Al_xGa_{1-x})_yIn_{1-y}P$ 4-element mixed crystal.

By transforming the composition formula of $(Al_xGa_{1-x})_yIn_{1-y}P$, we get $$(Al_xGa_{1-x})_yIn_{1-y}P = Al_{xy}Ga_{(1-x)y}In_{(1-y)}P \quad (1)$$

Since the mixed crystal will include xy, (1-x)y, and (1-y) of AlP, GaP, and InP, respectively, so the lattice constant at room temperature $a_{room}$ for each crystal is found by calculating the weighted mean of the lattice constant of each crystal, as shown by equation (2).

$$a_{room} = 0.54625xy + 0.54512(1-x)y + 0.58688(1-y) [nm] \quad (2)$$

And, the linear expansion coefficient $\beta_{epi}$ is obtained by calculating the weighted mean linear expansion coefficient of each, as in equation (3).

$$\beta_{epi} = 4.20xy + 5.91(1-x)y + 4.56(1-y) [\times 10^{-6}/K] \quad (3)$$

Thus, once the mixed crystal ratios x and y have been decided, the room temperature lattice constant $a_{room}$ and linear expansion coefficient $\beta_{epi}$ at 0 to 700 K of the $(Al_xGa_{1-x})_yIn_{1-y}P$ mixed crystal can be calculated.

Next, if T° C. is the epitaxial growth temperature and ΔT the temperature differential between growth temperature and room temperature, the lattice constant $a_T$ of the 4-element mixed crystal and the substrate lattice constant $s_T$ at the epitaxial growth temperature will be $$a_T = a_{room}(1 - \beta_{epi} \cdot \Delta T) \quad (4)$$

$$s_T = s_{room}(1 - \beta_{sub} \cdot \Delta T) \quad (5)$$

Here, $\beta_{epi}$ is the linear expansion coefficient of the epitaxially grown layer obtained from equation (3) and $\beta_{sub}$ is the linear expansion coefficient of the substrate (for example, GaAs).

Using equations (2) through (5) makes it possible to calculate the lattice constant $a_T$ at epitaxial growth temperature T° C. for a 4-element mixed crystal having mixed crystal ratios x and y. Once lattice constant $a_T$ at T° C. has been established, the degree of lattice mismatch ΔT at T° C. can be calculated.

If at a given temperature the substrate lattice constant is "s" and the lattice constant of the 4-element mixed crystal is "a", lattice mismatch "$\Delta a$" is defined by equation (6).

$$\Delta a = (s-a)/s \times 100 (\%) \qquad (6)$$

If the substrate is GaAs crystal and the epitaxial growth temperature for the $(Al_xGa_{1-x})_yIn_{1-y}P$ mixed crystal is 780° C., lattice mismatch $\Delta a_{room}$ and $\Delta a_{epi}$ for the known 4-element mixed crystal at room temperature and epitaxial growth temperature will be as shown in Table 2.

transition region, so the upper limit for the mixed crystal ratio x is set at 0.7. With a mixed crystal ratio x of zero the mixed crystal becomes GaInP having an emission wavelength of 650 nm (red). With a mixed crystal ratio x of 0.7, emission wavelength is 550 nm (green).

The bandgap energy of the cladding layers has to be greater than that of the active layer. If the bandgap energy of the cladding layer is lower than that of the active layer, carrier bandgap transition will cause it to act as an absorbent body, with respect to the emitted light. When the carrier confinement effect of the cladding layers is considered,

TABLE 2

| Crystal composition | Room temperature | | 780° C. | |
|---|---|---|---|---|
| | Lattice constant (nm) | Lattice mismatch (%) | Lattice constant (nm) | Lattice mismatch (%) |
| GaAs | 0.56533 | — | 0.56804 | — |
| $(Al_{0.7}Ga_{0.3})_{0.5}In_{0.5}P$ | 0.56640 | 0.190 | 0.56837 | 0.058 |
| $(Al_{0.2}Ga_{0.8})_{0.5}In_{0.5}P$ | 0.56612 | 0.140 | 0.56826 | 0.039 |
| $Al_{0.5}In_{0.5}P$ | 0.56601 | 0.120 | 0.56843 | 0.069 |
| $Ga_{0.5}In_{0.5}P$ | 0.56545 | 0.022 | 0.56822 | 0.032 |
| GaP | 0.54512 | 3.575 | 0.54754 | 3.610 |

From Table 2, it can be seen that the known AlGaInP 4-element mixed crystal has a lattice mismatch of 0.14 to 0.19% at room temperature, and at epitaxial growth temperature has a lattice mismatch of 0.039 to 0.058. Using for example $Al_{0.5}Ga_{0.5}P$ or $Ga_{0.5}In_{0.5}P$ as the current diffusion layer would further increase the lattice mismatch.

Thus, an LED formed of the known 4-element mixed crystal of AlGaInP which makes extensive use of heterojunction crystal surfaces having a major lattice mismatch at epitaxial growth temperatures exhibits a large hetero spike, which might be the reason why high brightness is not attained. The utmost effort has to be made to avoid lattice mismatching at epitaxial growth temperatures.

The method of matching lattices at epitaxial growth temperatures will now be explained.

The bandgap energy of a 4-element mixed crystal of AlGaInP is determined by the mixed crystal Al ratio. The mixed crystal ratio can be adjusted to impart the desired bandgap energy, using measurement of emitted light wavelength based on the photoluminescence of the prepared crystal. Table 3 shows the bandgap energy $E_g$ and the Al ratio x of the active layer for a target wavelength, with respect to a GaAs (100) substrate.

assuming that the LED will be used at room temperature, the bandgap energy of the cladding layers has to be at least 0.1 eV more than the bandgap energy of the active layer. Table 3 also lists the bandgap energies of cladding layers selected accordingly.

The lattice constant is determined by the In content; the In mixed crystal ratio (1-y) is set by the following procedure.

In general, the room-temperature crystal lattice constant of an epitaxially grown layer that is at least 0.1 μm thick can be precisely measured by the double crystal x-ray diffraction method or the like. Accordingly, the lattice constants of epitaxially grown crystals containing various x and y mixed crystal ratios are measured, and in accordance with equation (4), these values are then used to calculate the lattice constant at the epitaxial growth temperature (T° C.). Equation (6) can then be used to obtain the degree of lattice mismatch at T° C. These values should be used to select x and y mixed crystal ratios exhibiting a lattice mismatch of zero (i.e., perfect lattice matching) at the epitaxial growth temperature. In this way, the In mixed crystal ratio (1-y) is adjusted to obtain a specified lattice mismatch at room temperature. Specifically, in accordance with equations (4) and (5), lattice matching conditions at the epitaxial growth temperature are

TABLE 3

| | Target wavelength | Al ratio x and bandgap energy $E_g$ of active layer | | Al ratio x and bandgap energy $E_g$ of cladding layer | |
|---|---|---|---|---|---|
| | (nm) | x | $E_g$ | x | $E_g$ |
| Example 5 | 650 | 0.00 | 1.89 | ≧0.7 | ≧2.28 |
| Examples 1 to 4 | 620 | 0.17 | 2.00 | " | " |
| Examples 8 & 9 | | | | | |
| Comparative examples 1 & 2 | | | | | |
| Example 6 | 590 | 0.48 | 2.10 | 1.0 | 2.35 |
| Example 7 | 570 | 0.58 | 2.18 | " | " |

The above data is used to select the active layer mixed crystal Al ratio x that will provide the target emission wavelength. The bandgap energy of the AlGaInP mixed crystal increases with the increase in the mixed crystal Al ratio x, and at a ratio x of 0.7 and over enters the indirect $$a_T - s_T = a_{room}(1+\beta_{epi} \cdot \Delta T) - s_{room}(1+\beta_{sub} \cdot \Delta T) = 0 \qquad (7)$$

In equation (7) the right-hand term is growth temperature, which will be known once $\Delta T$ is set. $a_{room}$ and $s_{room}$ are provided by equations (4) and (5), respectively, and are both functions of x and y. However, since x is also constrained by the target bandgap energy, with respect to y, equation (7) becomes a quadratic equation. With respect to y, a solution is sought that satisfies the condition $0<y\leq 1$, room-temperature lattice constant $a_{room}$ is obtained by again substituting x and y in equation (2), and the lattice mismatch at room temperature is then obtained. Table 4 shows the degree of room-temperature lattice mismatching in AlGaInP mixed crystal which has been rigorously lattice matched at an epitaxial growth temperature of 780° C., in accordance with this procedure.

resistance. Thus, it is desirable to use Se or Te, preferably Se, as the n-type dopant.

P-type dopants that can be used for a p-type upper cladding layer include Zn, Cd, and Mg.

An upper cladding layer carrier concentration of $1\times 10^{16} cm^{-3}$ to $1\times 10^{18} cm^{-3}$ is used, and more preferably $3\times 10^{16} cm^{-3}$ to $1\times 10^{17} cm^{-3}$.

The other compositional elements of the epitaxial wafer used for the LED of the present invention will now be described, in order.

GaAs was selected for the substrate 1, since it can be lattice matched with the AlGaInP emission layer and good-

TABLE 4

| 780° C. | | Room temperature | | Mixed crystal ratio | | Crystal composition |
|---|---|---|---|---|---|---|
| Mismatch (%) | Lattice constant (nm) | Mismatch (%) | Lattice constant (nm) | x | 1 − y | $(Al_xGa_{1-x})_yIn_{1-y}P$ |
| 0.00 | 0.56804 | 0.085 | 0.56581 | 0.0000 | 0.5045 | $Ga_{0.4955}In_{0.5045}P$ |
| 0.00 | " | 0.095 | 0.56587 | 0.1700 | 0.5054 | $(Al_{0.1700}Ga_{0.8300})_{0.4946}In_{0.5054}P$ |
| 0.00 | " | 0.115 | 0.56598 | 0.4800 | 0.5069 | $(Al_{0.4800}Ga_{0.5200})_{0.4931}In_{0.5069}P$ |
| 0.00 | " | 0.122 | 0.56602 | 0.5800 | 0.5074 | $(Al_{0.5800}Ga_{0.4200})_{0.4926}In_{0.5074}P$ |
| 0.00 | " | 0.130 | 0.56606 | 0.7000 | 0.5080 | $(Al_{0.7000}Ga_{0.3000})_{0.4920}In_{0.5080}P$ |
| 0.00 | " | 0.150 | 0.56618 | 1.0000 | 0.5095 | $Al_{0.4905}In_{0.5095}P$ |

Fabricating a double hetero-junction light-emitting structure using $(Al_xGa_{1-x})_yIn_{1-y}P$ mixed crystal having the mixed crystal ratios x and y shown in Table 4 enables epitaxially grown crystal to be obtained that exhibits a good lattice match with a GaAs substrate at the epitaxial growth temperature, thereby providing an LED with high brightness and high reliability.

Table 4 is based on an epitaxial growth temperature of 780° C. However, even if the epitaxial growth temperature is changed, the same procedure can be used to select a 4-element mixed crystal composition that exhibits lattice matching at the epitaxial growth temperature.

An epitaxial growth temperature of 730° to 830° C. is appropriate for obtaining good quality 4-element mixed crystal. There will be slight lattice mismatching within this temperature range, but within permissible limits. Consequently, the range of the In mixed crystal ratio (1-y) is set at $0.5045\leq (1-y)\leq 0.5095$.

The layers comprising the double hetero-junction light-emitting structure are given a thickness that provides a high carrier containment effect in the active layer and a large degree of carrier recombination in the active layer (i.e., that gives increased brightness).

While a thinner active layer increases the likelihood of recombination of injected carriers (electrons and holes), the reduction in volume decreases the number of carriers that can be present. On the other hand, making the active layer thicker increases the number of carriers in the layer but reduces the likelihood of recombination. Therefore, the thickness of the active layer has been set at from 0.1 to 1.5 μm.

The effect of the cladding layers is to contain carriers in the active layer. Cladding layers 0.5 to 2 μm thick are used to prevent tunneling of carriers.

Si, Ge, Se and Te are n-type dopants that can be used for the n-type upper cladding layer. Of these, Si and Ge are amphoteric impurities that may act as a p-type depending on the growth temperature. Also, because Si becomes a deep-level impurity, it can give rise to absorption of the emitted light if it is used in a high concentration to reduce electrical quality GaAs crystal can be readily obtained. P-type or n-type GaAs can be used. Good-quality n-type GaAs crystal is easier to obtain. Si, Se, and Te are n-type dopants in common use.

Using a p-type substrate means that the opposite side will be n-type. For the upper cladding layer, good-quality n-type AlGaInP is easy to obtain, even when a high dopant concentration is used, and for the same carrier concentration exhibits higher electron mobility and lower resistance than p-type mixed crystal, imparting a powerful current diffusion effect to the upper cladding layer. Zn is the p-type dopant normally used, and a carrier concentration of not less than $1\times 10^{18} cm^{-3}$ is preferable. The substrate may have a (100) crystal orientation or an inclined orientation.

To prevent diffusion of impurities from the GaAs substrate 1 and to eliminate the effect of crystal defects, a GaAs buffer layer 2 is formed on the GaAs substrate 1. The buffer layer 2 is around 0.1 to 1.0 μm thick and has a carrier concentration of $1\times 10^{18} cm^{-3}$ to $6\times 10^{18} cm^{-3}$.

For the effective take-off of light emitted toward the GaAs substrate 1, a Bragg reflection layer (DBR) 3 comprised of multiple layers of AlGaAs is provided between the buffer layer 2 and the AlGaInP double hetero-structure. The DBR is basically a conventional type comprised of alternations of epitaxial layers 3a and 3b having mutually different refractive indexes. Ten to 25 sets of these layers are used to form a thickness that is ¼ the target emission wavelength (if n is the refractive index of the layer concerned and λ the target emission wavelength, layer thickness will be λ/4n).

With reference to an LED having an AlGaInP mixed crystal emission layer in accordance with the present invention, the AlGaAs conventionally utilized may be used. The two types of layer 3a and 3b used to comprise the reflection layer 3 are formed of $Al_{d1}Ga_{1-d1}As$ and $Al_{d2}Ga_{1-d2}As$ (d1<d2), respectively. Compositions are selected that 1) provide these layers with a large refractive index differential, and 2) exhibit minimal absorption in the wavelengths of interest, for which $0\leq d1\leq 0.5$ and $0.75\leq d2<1$ are appropriate. Conventionally, d2=1 is used to obtain high reflectivity; that is, AlAs has been used as one of the components of the reflection layer. However, AlAs is undesirable because, following formation, it is subject to rapid oxidation that can cause problems with respect to device longevity and the like. These problems can be avoided by adding small amounts of Ga. In this embodiment, d1=0.4 and d2=0.95 AlGaAs is used. Table 5 lists the DBR composition required to produce a device that emits light of the desired wavelength. This DBR provides a reflectivity of 90% or more at all wavelengths emitted by the active layer.

TABLE 5

| Emission wavelength [nm] | Thickness of DBR layers [nm] | | Example No. |
|---|---|---|---|
| | Layer 3a: $Al_{0.4}Ga_{0.6}As$ | Layer 3b: $Al_{0.95}Ga_{0.05}As$ | |
| 650 | 43.9 | 51.7 | 5 |
| 620 | 41.9 | 49.3 | 1 |
| 590 | 39.9 | 46.9 | 6 |
| 570 | 38.5 | 45.3 | 7 |

Figure 2:
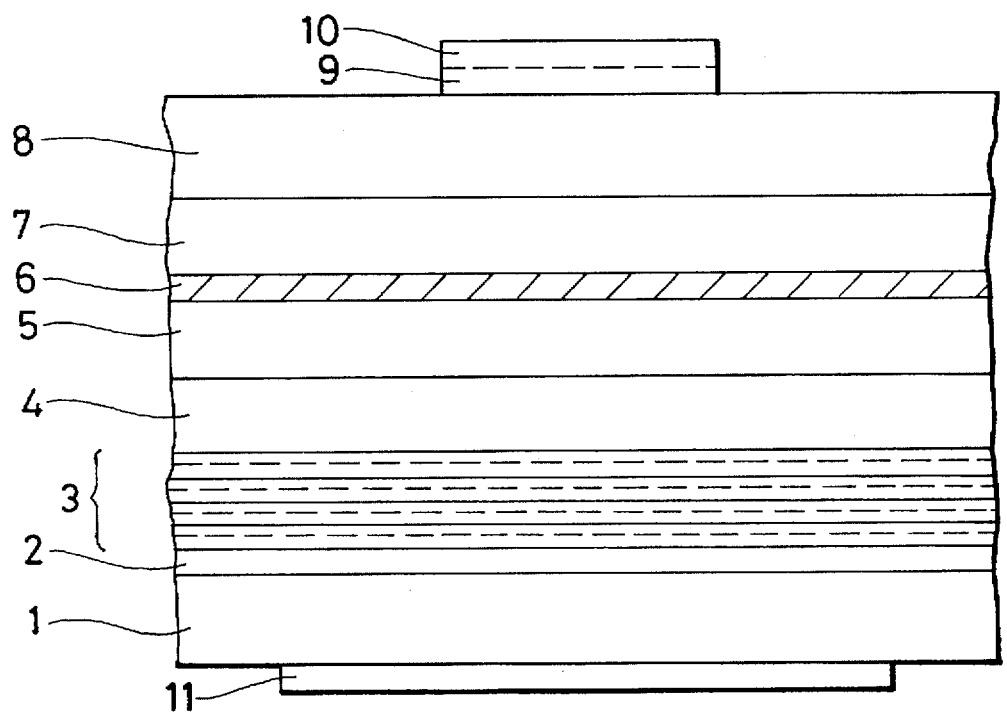
FIG. 2 is a cross-sectional view of the structure of a light-emitting diode according to a second embodiment of he invention.

An effective way of reducing resistance to carrier injection is to provide a compositional gradient layer 4 between the DBR 3 and the lower cladding layer 5 that alters the bandgap (FIG. 2). The increase in resistance is caused by the band offset between the final layer of the DBR and the lower cladding layer preventing the movement of carriers to the lower cladding layer. This is particularly pronounced when a p-type substrate is used and the DBR and lower cladding layer have become p-type. The bandgap-changing compositional gradient layer 4 includes Al, Ga, In, As and P, which are components of both the DBR and the lower cladding layer, and has a compositional gradient that goes from the composition of the final layer of the DBR to the composition of the lower cladding layer. When the substrate is p-type GaAs, the final DBR layer is $Al_{d2}Ga_{1-d2}As$ and d2=0.95, and the lower cladding layer is $(Al_xGa_{1-x})_yIn_{1-y}P$ in which x is 0.7 and y is 0.5, in the $Al_aGa_bIn_{1-a-b}As_{1-p}P_p$ of the compositional gradient layer the Al component a goes from 0.95 to 0.35, the Ga component b goes from 0.05 to 0.15, the In component 1-a-b goes from 0 to about 0.5, the As component 1-p goes from 1 to 0, and the P component p goes from 0 to 1, going from the upper interface of the DBR to the lower cladding layer interface.

Figure 3:
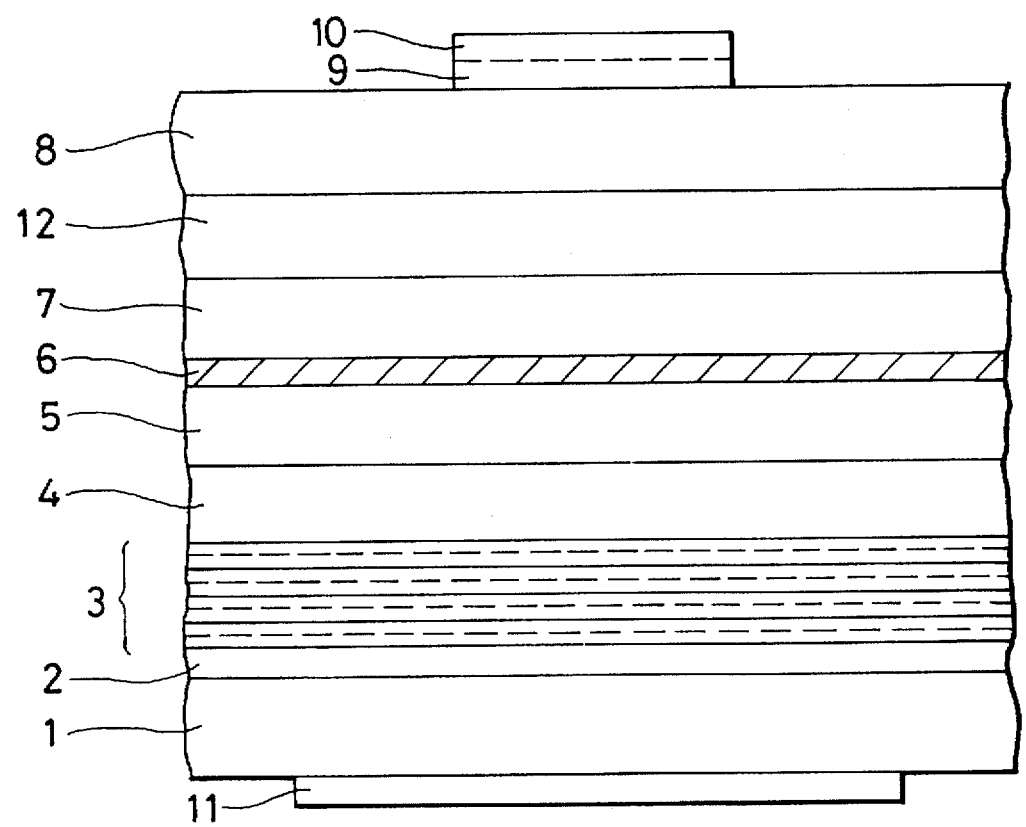
FIG. 3 is a cross-sectional view of the structure of a light-emitting diode according to a third embodiment of the invention.
Figure 4:
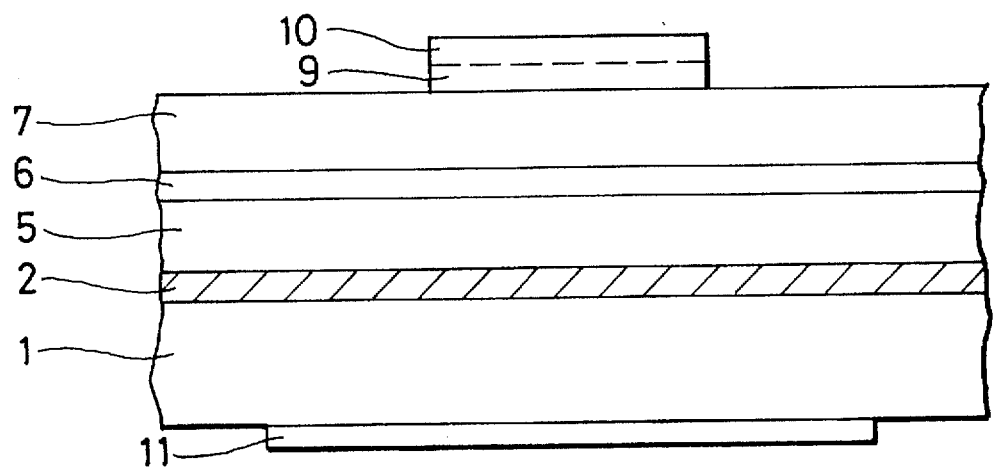
FIG. 4 is a cross-sectional view of the structure of a conventional (AlGa)InP double hetero-structure light-emitting diode.
Figure 5:
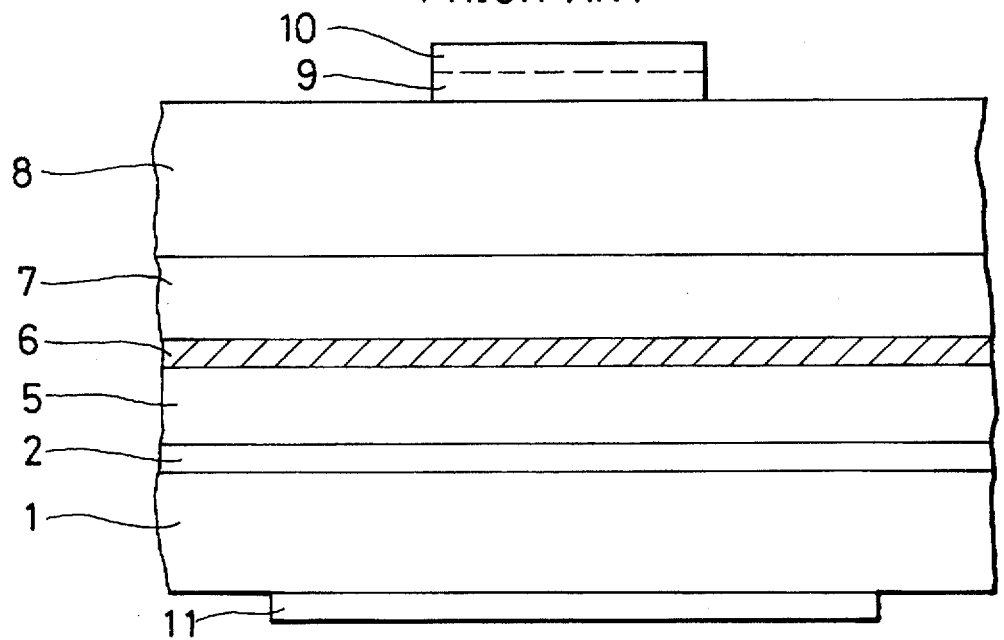
FIG. 5 is a cross-sectional view of the structure of a conventional (AlGa)InP light-emitting diode provided with a GaAlAs current diffusion layer.

An effective way of increasing device brightness and improving reliability is to alleviate lattice mismatching between the upper cladding layer 7 and the GaP current diffusion layer 8 by providing an AlGaInP compositional gradient layer 12 between those layers (FIG. 3). Conventional ways of alleviating lattice mismatching include changing the composition in steps, using a superlattice and using linear compositional gradients, or combinations thereof. Each method is effective, but not as effective as lattice matching at the double hetero-junction growth temperature. Below the compositional gradient layer 12 is described with reference to a linear compositional gradient, which is the easiest to produce.

In the case of an $(Al_xGa_{1-x})_yIn_{1-y}P$ upper cladding layer in which x=1.0 and y=0.5, that is, an AlInP upper cladding layer, in the $Al_aGa_bIn_{1-a-b}As_{1-p}P$ of the compositional gradient from the upper interface of the upper cladding layer 7 to the GaP current diffusion layer 8 interface, the Al component a gradient is 0.5 to 0, the Ga component b gradient is 0 to 1 and the In component 1-a-b gradient is about 0.5 to 0. The desired effect is achieved if the thickness of the layer 12 is 0.5 μm or more. The effect is heightened as the thickness is increased, meaning the smaller the change in the lattice constant. However, there is a limit to how thick a layer can be formed with MOCVD, which is at present the most effective method of growing AlGaInP films. An appropriate, practicable thickness is one that is from 0.5 to 10 μm. Conductivity type and added impurities are the same as those of the upper cladding layer.

A GaP current diffusion layer 8 is grown on the upper cladding layer. GaP is an optically suitable material for the current diffusion layer as it has a higher bandgap energy than the AlGaInP emission layer of the device. However, there is a lattice mismatch of about 3.6% between GaP and GaAs. Concerning the compositional conditions of the double hetero portion, it has long been clear that a lattice mismatch causes deterioration of device brightness. However, when the lattice matching condition at the double hetero portion growth temperature is rigorously met using an upper cladding layer at least 0.5 μm thick, the degree of deterioration is reduced to a level at which, in practical terms, it is insignificant.

The GaP current diffusion layer 8 has to be at least thick enough to ensure that the injected current is diffused over the whole area of the emission layer. An effective thickness is one in the range of from 30 to 300 μm. Increasing the thickness beyond that range does not provide much of an increase in brightness. Conductivity type is the same as that of the upper cladding layer 7, so the polarity is therefore opposite to that of the substrate. The type of added impurity used to obtain the required polarity is not limited. However, vapor-phase epitaxy (VPE) is an effective method of forming layers 30 to 300 μm thick, and alkyl compounds of Te or hydrogen sulfide can be used to produce n-type GaP. There is no suitable p-type impurity to use during the growth process, so after formation of the undoped GaP the topmost layer of the GaP current diffusion layer is transformed to a p-type by Zn diffusion in a diffusion furnace. The carrier concentration has to be higher than that of the upper cladding layer. An appropriate carrier concentration that ensures the crystallinity of the current diffusion layer is maintained is $5 \times 10^{17}$ to $5 \times 10^{18} cm^{-3}$.

An effective way of enhancing the current diffusion effect and preventing diffusion of impurities into the upper cladding layer 7 is to gradually increase the carrier concentration, going from the interface with the upper cladding layer toward the top electrode. A GaAsP compositional gradient layer 12 can be formed inside the current diffusion layer 8 by gradual addition of As during growth formation of the GaP. This also enables the current diffusion effect to be increased by increasing the degree of carrier movement on the electrode 10 side of the current distribution layer.

A contact layer 9 is then formed on the current diffusion layer 8, and an ohmic electrode 10 is formed on the contact layer 9. An ohmic electrode 11 formed on the underside of the GaAs substrate 1, completing the LED.

A material should be chosen for the contact layer 9 that can readily form an ohmic connection with the metal electrode 10. GaAs is an ideal material for the LED structure of this invention, and 0.1 to 1 μm is a suitable thickness. The carrier concentration needs to be not less than $1 \times 10^{18} cm^{-3}$.

Au/Au-Ge can be used for n-type electrodes and Au/Au-Be for p-type electrodes.

An LED wafer thus fabricated provides sufficient diffusion of current injected from the top electrode, resulting in an LED with high output, meaning high brightness.

In the LED of the invention having an $(Al_xGa_{1-x})_yIn_{1-y}P$ double hetero light-emitting structure, the double hetero light-emitting structure is lattice matched with the substrate at the epitaxial growth temperature and GaP having a low relative resistance is used for the current diffusion layer, providing a powerful current-diffusion effect. Lattice matching at the epitaxial growth temperature results in the formation of good-quality crystal, and a high-reliability LED that has a low operating voltage but exhibits high brightness over a broad range of emission regions from red to green, providing a major contribution to expanding outdoor applications for LEDs.

Examples of the present invention are described below. However, the invention is not limited to these examples.

EXAMPLE 1

The type of LED shown in FIG. 1 was fabricated by forming a AlGaInP double hetero-junction structure on an n-type GaAs substrate, said double hetero-junction structure having an emission layer with an emission wavelength of 620 nm.

The substrate 1 was formed using Si-doped n-type GaAs single crystal. Carrier concentration was $2.0 \times 10^{18} \text{cm}^{-3}$. A crystal plane orientation of 4 degrees off (100) was used.

First, MOCVD was used to epitaxially grow a GaAs buffer layer 2 on the substrate 1. The buffer layer 2 was Si-doped and given a carrier concentration of $1 \times 10^{18} \text{cm}^{-3}$ and a thickness of 0.5 μm.

The buffer layer 2 was overlaid by a reflection layer 3. This reflection layer 3 was comprised of twelve alternations of an Se-doped, 41.9 nm thick $Al_{0.4}Ga_{0.6}As$ layer 3a and an Se-doped, 49.3 nm thick $Al_{0.95}Ga_{0.05}As$ layer 3b. Layers 3a and 3b had an average carrier concentration of $1.5 \times 10^{18} \text{cm}^{-3}$.

The $(Al_xGa_{1-x})_yIn_{1-y}P$ double hetero-junction light-emitting structure was then formed. To obtain an emission wavelength of 620 nm, the bandgap energy $E_g$ of the active layer 6 was set at 2.00 eV. To ensure the carrier containment effect of lower cladding layer 5 and upper cladding layer 7 and their transparency to the emitted light, the bandgap energy $E_g$ of the cladding layers was set at 2.29 eV, 0.29 eV higher than that of the active layer 6. As a result, the Al mixed crystal ratio x was approximately 0.17 in the case of the active layer 6, and approximately 0.7 in the case of the lower and upper cladding layers 5 and 7.

The temperature for epitaxial growth of the double hetero-junction light-emitting portion was set at 780° C., and the lattice constant was perfectly matched to the GaAs substrate at that growth temperature. The lattice constant of GaAs at 780° C. is 5.6804 Å, so the above equations were used to determine the x and y mixed crystal ratios that would produce a lattice constant of 5.6804 Å in the 4-element mixed crystal layers of the double hetero-junction. The mixed crystal ratios x and y that would satisfy the required bandgap energy lattice constant conditions in accordance with the gist of this invention were therefore calculated, resulting in the composition $(Al_{0.1700}Ga_{0.8300})_{0.4946}In_{0.5054}P$ for the active layer 6 and $(Al_{0.7000}Ga_{0.3000})_{0.4920}In_{0.5080}P$ for the cladding layers 5 and 7.

The above crystal compositions were obtained by adjusting the gas mix used by the MOCVD process. The gases used were TMAl, TMGa, TMIn, DEZn, arsine, phosphine and hydrogen selenide. Se-doping was used to form the lower cladding layer 5 as an n-type layer, the active layer 6 was undoped, and Zn-doping was used to form the upper cladding layer 7 as a p-type layer. The thicknesses of the lower cladding layer 5, active layer 6 and upper cladding layer 7 were 1 μm, 0.5 μm and 1 μm, respectively.

The carrier concentration of each of the layers of the resultant double hetero-junction structure was measured, and found to be $1 \times 10^{17} \text{cm}^{-3}$ in the case of the lower cladding layer 5, $1 \times 10^{16} \text{cm}^{-3}$ in the case of the active layer 6 and $3 \times 10^{17} \text{cm}^{-3}$ in the case of the upper cladding layer 7.

The lattice constant of each of the layers was measured, and the degree of lattice mismatch was measured in accordance with equation (6). Lattice mismatch Aa was 0.12% with respect to lower cladding layer 5, 0.09% with respect to active layer 6 and 0.10% with respect to upper cladding layer 7, so lattice matching of each layer was distinctly improved compared to the prior art.

A GaP current diffusion layer was provided over the double hetero-junction light-emitting structure. This GaP current diffusion layer was a Zn-doped p-type with a thickness of 100 μm, a carrier concentration of $7 \times 10^{17} \text{cm}^{-3}$ and a relative resistance of 0.1 Ω.cm.

Finally, a Zn-doped p-type GaAs contact layer 9 0.3 μm thick, and with a carrier concentration of $1 \times 10^{18} \text{cm}^{-3}$, was formed on the current diffusion layer. An ohmic electrode 10 was then formed on the contact layer 9 by deposition of Au-Be)/Au, and an ohmic electrode 11 of (Au-Ge)/Au was formed on the underside of the substrate, thereby completing the LED.

An evaluation of the characteristics of the LED showed the wavelength was 620 nm, output at a current of 20 mA was 80 a.u. (arbitrary units, a value obtained using a special measuring device), operating voltage $V_F$ was 1.88 V, and a test to examine deterioration after 1000 hours of operation showed a light output ratio of 95%, an excellent result that signified almost no deterioration.

The main compositional elements and device characteristics are shown in Table 6.

TABLE 6

| | GaAs substrate (1) | | Compositional gradient (4) | DH emmission region (5, 6, 7) | | Compositional gradient (12) | Current diffusion layer (8) | | Emmission wavelength (nm) | Relative output (a.u.) | $V_F$ (V) | Output after 1000 hrs opertaion (%) |
|---|---|---|---|---|---|---|---|---|---|---|---|---|
| | Conductivity | Inclination | | Lattice matching temp. (°C.) | Cladding layer $E_g$ (V) | | Crystal | Thickness (μm) | | | | |
| Example 1 | n | 4° | No | 780 | 2.28 | No | GaP | 100 | 620 | 80 | 1.88 | 95 |
| Example 2 | p | 4° | No | " | " | No | " | " | 620 | 100 | 1.95 | 85 |
| Example 3 | p | 4° | Yes | " | " | No | " | " | 620 | 95 | 1.85 | 95 |
| Example 4 | p | 4° | Yes | " | " | Yes | " | " | 620 | 106 | 1.85 | 98 |
| Example 5 | p | 4° | Yes | " | " | Yes | " | " | 650 | 138 | 1.80 | 105 |

TABLE 6-continued

| | GaAs substrate (1) | | DH emmission region (5, 6, 7) | | | Current diffusion layer (8) | | | | | | Output after 1000 hrs |
|---|---|---|---|---|---|---|---|---|---|---|---|---|
| | Conductivity | Inclination | Compositional gradient (4) | Lattice matching temp. (°C.) | Cladding layer $E_g$ (V) | Compositional gradient (12) | Crystal | Thickness (µm) | Emmission wavelength (nm) | Relative output (a.u.) | $V_F$ (V) | opertaion (%) |
| Example 6 | p | 4° | Yes | " | 2.35 | Yes | " | " | 590 | 99 | 1.90 | 98 |
| Example 7 | p | 4° | Yes | " | " | Yes | " | " | 570 | 89 | 1.93 | 92 |
| Example 8 | p | 4° | Yes | " | 2.28 | Yes | " | 300 | 620 | 98 | 1.98 | 98 |
| Example 9 | p | 15° | Yes | " | " | Yes | " | 100 | 620 | 170 | 1.90 | 98 |
| Comparative example 1 | n | 4° | No | 780 | 2.28 | No | $Al_{0.7}Ga_{0.3}As$ | 10 | 620 | 40 | 1.85 | 60 |
| | | | | | | | | | 620 | 40 | 1.87 | 55 |
| Comparative example 2 | n | 4° | No | Room temp. | " | No | GaP | 100 | | | | |

EXAMPLE 2

An LED was fabricated by forming a AlGaInP double hetero-junction structure with a 620 nm emission layer on a p-type GaAs substrate. The substrate 1 was formed of Zn-doped p-type GaAs single crystal. Carrier concentration was $5.0 \times 10^{18} cm^{-3}$. Crystal plane orientation was 4 degrees off (100).

First, MOCVD was used to epitaxially grow a GaAs buffer layer 2 on the substrate 1. The buffer layer 2 was Zn-doped, and was given a carrier concentration of $1 \times 10^{18} cm^{-3}$ and a thickness of 0.5 µm.

The buffer layer 2 was overlaid by a DBR reflection layer 3. This DBR reflection layer 3 was comprised of twelve alternations of a Zn-doped, 41.9 nm thick $Al_{0.4}Ga_{0.6}As$ layer 3a and a Zn-doped, 49.3 nm thick $Al_{0.95}Ga_{0.05}As$ layer 3b. The average carrier concentration of the two layers was $1.5 \times 10^{18} cm^{-3}$.

The $(Al_xGa_{1-x})_yIn_{1-y}P$ double hetero-junction light-emitting structure was then formed. An emission wavelength of 620 nm was obtained by the same procedure used in example 1 was used, except that the conductivities of the active layer 6, lower cladding layer 5 and upper cladding layer 1.

A GaP current diffusion layer 8 was provided over the double hetero-junction light-emitting structure. This GaP current diffusion layer was a Se-doped n-type with a thickness of 100 µm, a carrier concentration of $5 \times 10^{17} cm^{-3}$ and a relative resistance of 0.1 Ω.cm.

Finally, a Se-doped n-type GaAs contact layer 9 0.3 µm thick, and with a carrier concentration of $1 \times 10^{18} cm^{-3}$, was formed on the upper cladding layer 7. An ohmic electrode 10 was then formed on the contact layer 9 by deposition of (Au-Be)/Au, and an ohmic electrode 11 of (Au-Ge)/Au was formed on the underside of the substrate, thereby completing the LED.

LED characteristics were then evaluated. This showed that the wavelength was 620 nm, output at a current of 20 mA was 80 a.u., operating voltage VF was 1.95 V, and a test to examine deterioration after 1000 hours of operation showed a light output ratio of 85%, a good result. The main compositional elements and device characteristics are shown in Table 6.

EXAMPLE 3

An LED was fabricated by providing the LED of example 2 with a bandgap-changing compositional gradient layer 4 which is disposed between the DBR reflection layer 3 and the lower cladding layer 5 as shown in FIG. 2, thereby reducing resistance to injected carriers.

The compositional gradient layer 4 was a Zn-doped 5-element mixed crystal, $Al_aGa_bIn_{1-a-b}As_{1-p}P_p$, with an Al component a gradient of 0.95 to 0.3444, a Ga component b gradient of 0.05 to 0.1476, an In component 1-a-b gradient of 0 to about 0.5080, an As component 1-p gradient of 1 to 0, and a P component p gradient of 0 to 1, the gradient running from the upper interface of the DBR to the lower cladding layer interface. Layer thickness was 0.1 µm and the carrier concentration was $3 \times 10^{17} cm^{-3}$. Other aspects were the same as example 2.

Although the LED exhibited a light output of 80 a.u., somewhat lower than example 2, the VF was a lower 1.85 eV, meaning it was an easy-to-use LED. The characteristics of this LED are shown in Table 6.

EXAMPLE 4

An LED was fabricated by inserting between the upper cladding layer 7 and current diffusion layer 8 of the LED of example 3, the compositional gradient layer 12 shown in FIG. 3, to alleviate the adverse effects of lattice mismatching.

The compositional gradient layer 12 was the Se-doped 4-element mixed crystal $Al_aGa_bIn_{1-a-b}P$, with an Al component a gradient of 0.3444 to 0, a Ga component b gradient of 0.1476 to 1 and an In component 1-a-b gradient of 0.5080 to 0, the gradient running from the upper interface of the upper cladding layer 7 to the interface with the Gap current diffusion layer 8. Layer thickness was 1.0 µm and the carrier concentration was $3 \times 10^{17} cm^{-3}$. Other aspects were the same as example 3.

This LED exhibited a low $V_F$ and an output of 106 a.u., a major improvement. LED characteristics are shown in Table 6.

EXAMPLE 5

The bandgap energy $E_g$ of the active layer 6 was set at 1.89 eV to form an LED having an emission wavelength of 650 nm. The bandgap energy $E_g$ of the lower cladding layer 5 and upper cladding layer 7 was set at 2.18 eV, 0.29 eV higher than that of the active layer 6. This resulted in an Al mixed crystal ratio x of 0.0 in the case of the active layer 6, and approximately 0.7 in the case of cladding layers 5 and 7. Epitaxial growth was effected at 780° C., at which temperature perfect lattice matching with the GaAs substrate was effected. Specifically, the above equations were used to calculate x and y values required to meet the requisite bandgap energy and lattice constant conditions, resulting in an active layer 6 composition of $Ga_{0.4955}In_{0.5045}P$, and a composition of $(Al_{0.7000}Ga_{0.3000})_{0.4920}In_{0.5080}$ for the cladding layers 5 and 7. Other than this, the LED was fabricated using the same conditions as example 2.

The characteristics of the LED were then evaluated, and showed the wavelength was 620 nm, output at a current of 20 mA was 138 a.u., and $V_F$ was 1.80 V, and a test to examine deterioration after 1000 hours of operation showed a light output ratio of 105%, a good result showing no deterioration. LED characteristics are shown in Table 6.

EXAMPLE 6

The bandgap energy $E_g$ of the active layer 6 was set at 2.10 eV to form an LED having an emission wavelength of 590 nm. The bandgap energy $E_g$ of the lower cladding layer 5 and upper cladding layer 7 was set at 2.35 eV, 0.25 eV higher than that of the active layer 6. This resulted in an Al mixed crystal ratio x of 0.4800 in the case of the active layer 6, and approximately 1.0 in the case of cladding layers 5 and 7. Epitaxial growth was effected at 780° C., at which temperature perfect lattice matching with the GaAs substrate was effected. Specifically, the above equations were used to calculate x and y values required to meet the requisite bandgap energy and lattice constant conditions, resulting in an active layer 6 composition of $(Al_{0.4800}Ga_{0.5200})_{0.4931}In_{0.5069}P$, and a composition of $Al_{0.4905}In_{0.5095}P$ for the cladding layers 5 and 7. Other than this, the LED was fabricated using the same conditions as example 2.

The characteristics of the LED were then evaluated, and showed a wavelength of 590 nm, output at a current of 20 mA of 99 a.u., a $V_F$ of 1.90 V, and a test to examine deterioration after 1000 hours of operation showed a light output ratio of 98%, a good result. LED characteristics are shown in Table 6.

EXAMPLE 7

The bandgap energy $E_g$ of the active layer 6 was set at 2.18 eV to form an LED having an emission wavelength of 570 nm. The bandgap energy $E_g$ of the lower cladding layer 5 and upper cladding layer 7 was set at 2.35 eV, 0.17 eV higher than that of the active layer 6. This resulted in an Al mixed crystal ratio x of 0.5800 in the case of the active layer 6, and 1.0 in the case of cladding layers 5 and 7. Epitaxial growth was effected at 780° C., at which temperature perfect lattice matching with the GaAs substrate was effected. Specifically, the above equations were used to calculate x and y values required to meet the requisite bandgap energy and lattice constant conditions, resulting in an active layer 6 composition of $(Al_{0.5800}Ga_{0.4200})_{0.4926}In_{0.5074}P$, and a composition of $Al_{0.4905}In_{0.5095}P$ for the cladding layers 5 and 7. Other than this, the LED was fabricated using the same conditions as example 2.

The characteristics of the LED were then evaluated, and showed that wavelength was 570 nm, output at a current of 20 mA was 89 a.u., the $V_F$ was 1.93 V, and a test to examine deterioration after 1000 hours of operation showed a light output ratio of 92%, a good result. The characteristics of this LED are shown in Table 6.

EXAMPLE 8

In the LED of example 4 the thickness of the GaP current diffusion layer was 100 μm. For this example, this was increased to 300 μm. Otherwise, the LED was the same as the one of example 4.

The resulting LED had a wavelength of 620 nm, an output at a current of 20 mA of 98 a.u., a $V_F$ of 1.98 V, and a test to examine deterioration after 1000 hours of operation showed a light output ratio of 98%. The characteristics of this LED are shown in Table 6. The three-fold increase in the thickness of the GaP current diffusion layer produced a slight increase in emission intensity, but there was an increase in device resistance, probably accompanying this increase in the thickness of the layer. Thus, it is considered that there is a limit to how much output intensity can be increased by increasing the thickness of the current diffusion layer.

EXAMPLE 9

While in the LED of example 4 the GaAs substrate was given an orientation of 4 degrees off (100), for this example this was increased to 15 degrees off.

The resulting LED had a wavelength of 620 nm, an output of 170 a.u. at 20 mA, a $V_F$ of 1.90 V, and a 1000-hour deterioration test output ratio of 98%. Characteristics of this LED are shown in Table 6.

Thus, increasing the inclination of the substrate orientation resulted in an approximately 1.6-fold increase in light output compared to the LED of example 4 which has an otherwise identical construction. It is assumed that the reason for this increase is that the change produced stable 2-dimensional growth that improved the crystallinity of the active layer. In fact, since a sharp increase in the photoluminescence of the active layer was observed, the crystallinity was certainly improved. However, with respect to the mechanism of this improvement in crystallinity, verification has not yet been obtained to back up the above assumption. However, it is a highly reproducible fact that photoluminescence of the active layer and the emission output of the device is increased by using an inclined GaAs substrate.

COMPARATIVE EXAMPLE 1

For comparison, an LED was fabricated having an AlGaInP double hetero light-emitting structure with an emission wavelength of 620 nm, said structure being formed on an n-type substrate. A Si-doped GaAs substrate 1 with a carrier concentration of $2.0 \times 10^{18} cm^{-3}$ and an orientation of 4 degrees off (100) was used. MOCVD was used to epitaxially grow the light-emitting structure on the substrate at a temperature of 780° C. First a GaAs buffer layer was grown on the substrate. This buffer layer was 0.5 μm thick and had a carrier concentration of $1.0 \times 10^{18} cm^{-3}$. Next, a reflection layer was formed on the substrate. This reflection layer 3 was comprised of twelve alternating laminations of a Se-doped, 41.9-nm-thick n-type $Al_{0.4}Ga_{0.6}As$ layer and a Se-doped, 49.3-nm-thick n-type AlAs layer. The two layers had an average carrier concentration of $1.5 \times 10^{18} cm^{-3}$.

An AlGaInP double hetero light-emitting structure was then formed on the reflection layer. To obtain an emission wavelength of 620 nm, the bandgap energy of the active layer was set at 2.00 eV and the bandgap energy of the upper and lower cladding layers was set at 2.29 eV. The mixed crystal ratio of the In was also set to effect lattice matching at an epitaxial growth temperature of 780° C., resulting in an active layer composition of $(Al_{0.1700}Ga_{0.8300})_{0.4946}In_{0.5054}P$, and a cladding layer composition of $(Al_{0.7000}Ga_{0.3000})_{0.4920}In_{0.5080}P$. This resulted in zero lattice mismatch at 780° C.

The lower cladding layer was an Se-doped n-type with a carrier concentration of $1 \times 10^{18} cm^{-3}$ and a thickness of 1

µm. The active layer was undoped, and had a carrier concentration of $1\times10^{16}\text{cm}^{-3}$ and a thickness of 0.5 µm. The upper cladding layer was a Zn-doped p-type with a carrier concentration of $1\times10^{17}\text{cm}^{-3}$ and a thickness of 1 µm.

A 10 µm thick, Zn-doped p-type current diffusion layer of $Ga_{0.3}Al_{0.7}As$ was then formed, followed by the formation of a Zn-doped p-type GaAs contact layer having a carrier concentration of $1\times10^{18}\text{cm}^{-3}$ and a thickness of 0.3 µm. An ohmic electrode was then formed on the contact layer by (Au-Be)/Au deposition, and an ohmic electrode of (Au-Ge)/Au was formed on the underside of the substrate. An evaluation of the characteristics of this LED formed using a GaAlAs current diffusion layer showed it had an emission wavelength of 620 nm, output at 20 mA of 40 a.u., a $V_F$ of 1.85 V, and a test to examine deterioration after 1000 hours of operation at 50 mA showed a deterioration of approximately 60% in light output. For comparison, the characteristics of the LED are included in Table 6.

COMPARATIVE EXAMPLE 2

GaP was used to form a current diffusion layer instead of the GaAlAs used in comparative example 1. The GaP layer had a carrier concentration of $7\times10^{17}\text{cm}^{-3}$ and a thickness of 100 µm. The In ratio was set to achieve lattice matching between the AlGaInP double hetero-junction light-emitting structure and the GaAs substrate, at room temperature. This resulted in an active layer composition of $(Al_{0.17}Ga_{0.83})_{0.5184}In_{0.4816}P$, and an upper and lower cladding layer composition of $(Al_{0.7}Ga_{0.3})_{0.52612}In_{0.47388}P$.

An evaluation of the characteristics of this LED showed it had an emission wavelength of 620 nm, an output at 20 mA of 40 a.u., a $V_F$ of 1.87 V, and a test to examine deterioration after 1000 hours of operation at 50 mA showed a deterioration of approximately 55% in light output. For comparison, the characteristics of the LED are included in Table 6.

What is claimed is:

1. An AlGaInP light-emitting diode, comprising:
   a GaAs substrate having an ohmic electrode on its rear surface,
   a reflection layer comprised of a lamination of multiple layers provided on the GaAs substrate,
   a double hetero-junction light-emitting structure of $(Al_xGa_{1-x})_yIn_{1-y}P$ provided on the reflection layer, said light-emitting structure being comprised of an active layer between upper and lower cladding layers, with each of the layers being lattice matched to the GaAs substrate at an epitaxial growth temperature,
   a current diffusion layer formed of GaP provided on the double hetero-junction light-emitting structure, and
   an ohmic electrode provided on the current diffusion layer.

2. A light-emitting diode according to claim 1 that includes a bandgap changing compositional gradient layer between the reflection layer and the double hetero-junction light-emitting structure.

3. A light-emitting diode according to claim 1 that includes a compositional gradient layer to alleviate lattice mismatching, between the upper cladding layer and the current diffusion layer.

4. A light-emitting diode according to claim 1, wherein room-temperature lattice mismatch between each of the layers of the double hetero-junction and the GaAs substrate is not less than 0.085% and less than 0.140%.

5. A light-emitting diode according to claim 1, wherein an In mixed crystal ratio (1-y) in each of the layers of the double hetero-junction is $0.5045 \leq (1-y) \leq 0.5095$.

6. A light-emitting diode according to claim 1, wherein the reflection layer is a lamination of two types of AlGaAs layers having different Al mixed crystal ratios, one of the AlGaAs layers having an Al mixed crystal ratio of 0.95 to 1 and the other of the AlGaAs layers having an Al mixed crystal ratio of 0.35 to 0.75.

7. An AlGaInP light-emitting diode, comprising:
   a GaAs substrate having an ohmic electrode on its rear surface,
   a reflection layer comprised of a lamination of multiple layers provided on the GaAs substrate,
   a compositional gradient layer provided on the reflection layer,
   a double hetero-junction light-emitting structure of $(Al_xGa_{1-x})_yIn_{1-y}P$ provided on the compositional gradient layer, said light-emitting structure being comprised of an active layer between upper and lower cladding layers, with each of the layers being lattice matched to the GaAs substrate at an epitaxial growth temperature,
   a current diffusion layer formed of GaP provided on the double hetero-junction light-emitting structure, and
   an ohmic electrode provided on the current diffusion layer.

8. A light-emitting diode according to claim 7, wherein room-temperature lattice mismatch between each of the layers of the double hetero-junction and the GaAs substrate is not less than 0.085% and less than 0.140%.

9. A light-emitting diode according to claim 7, wherein an In mixed crystal ratio (1-y) in each of the layers of the double hetero-junction is $0.5045 \leq (1-y) \leq 0.5095$.

10. An AlGaInP light-emitting diode, comprising:
    a GaAs substrate having an ohmic electrode on its rear surface,
    a reflection layer comprised of a lamination of multiple layers provided on the GaAs substrate,
    a compositional gradient layer provided on the reflection layer,
    a double hetero-junction light-emitting structure of $(Al_xGa_{1-x})_yIn_{1-y}P$ provided on the compositional gradient layer, said light-emitting structure being comprised of an active layer between upper and lower cladding layers, with each of the layers being lattice matched to the GaAs substrate at an epitaxial growth temperature,
    a compositional gradient layer provided on the double hetero-junction light-emitting structure,
    a current diffusion layer formed of GaP provided on the compositional gradient layer, and
    an ohmic electrode provided on the current diffusion layer.

11. A light-emitting diode according to claim 10, wherein room-temperature lattice mismatch between each of the layers of the double hetero-junction and the GaAs substrate is not less than 0.085% and less than 0.140%.

12. A light-emitting diode according to claim 10, wherein an In mixed crystal ratio (1-y) in each of the layers of the double hetero-junction is $0.5045 \leq (1-y) \leq 0.5095$.

* * * * *

UNITED STATES PATENT AND TRADEMARK OFFICE
CERTIFICATE OF CORRECTION

PATENT NO.: 5,744,829
DATED : April 28, 1998
INVENTOR(S): MURASATO et al.

It is certified that errors appear in the above-identified patent and that said Letters Patent is hereby corrected as shown below:

On the title page of the patent please insert --Foreign Application Priority Data December 28, 1995 [JP] Japan ......7-342409--

Column 4 in column 1 of Table 1, change "Cryst-" to --Crys- --; change "al" to --tal--; and in that column, change "AIP" to --AlP--.

Column 4, lines 55 and 56, change "-" to -- + --; and line 66, change "$\Delta T$" to --$\Delta a$--.

Column 6, line 31, change "content; the" to --content. The--.

Column 11, lines 48 and 50, change "5.6804 Å" to --0.56804 nm--.

Signed and Sealed this

Second Day of February, 1999

Attest:

Attesting Officer

*Acting Commissioner of Patents and Trademarks*